United States Patent
Nakanishi et al.

(10) Patent No.: US 6,537,726 B2
(45) Date of Patent: Mar. 25, 2003

(54) CHEMICALLY AMPLIFIED POSITIVE RESIST COMPOSITION

(75) Inventors: Junji Nakanishi, Kyoto (JP); Yoshiyuki Takata, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 110 days.

(21) Appl. No.: 09/770,212

(22) Filed: Jan. 29, 2001

(65) Prior Publication Data

US 2001/0016298 A1 Aug. 23, 2001

(30) Foreign Application Priority Data

Jan. 31, 2000 (JP) .......................... 2000-021687

(51) Int. Cl.$^7$ .............................. G03F 7/004
(52) U.S. Cl. ...................... 430/270.1; 430/914; 430/910
(58) Field of Search .................... 430/270.1, 91.1, 430/910

(56) References Cited

U.S. PATENT DOCUMENTS

| | | |
|---|---|---|
| 5,968,713 A | 10/1999 | Nozaki et al. |
| 6,013,416 A | 1/2000 | Nozaki et al. |
| 6,383,713 B1 * | 5/2002 | Uetani et al. ............ 430/270.1 |

FOREIGN PATENT DOCUMENTS

| | | | |
|---|---|---|---|
| JP | 9090637 A | | 4/1997 |
| JP | 10207069 A | | 8/1998 |
| JP | 10319595 A | | 12/1998 |
| JP | 2000347408 | * | 12/2000 |

OTHER PUBLICATIONS

Chemical Abstract DN 234:63888 of JP 2000347408, 12–2000.*
JPO Abstract of JP 2000347408, 12–2000.*
Translation of JP 2000347408, 12–2000.*

* cited by examiner

*Primary Examiner*—Rosemary Ashton
(74) *Attorney, Agent, or Firm*—Birch, Stewart, Kolasch & Birch, LLP

(57) ABSTRACT

A chemically amplified positive resist composition capable of giving a resist film excellent in adhesion to a substrate; excellent in various resist performance characteristics such as dry etching resistance, sensitivity and resolution; and comprising a resin (X) which, per se, is insoluble or slightly soluble in alkali but becomes soluble in alkali due to an action of acid, and has a polymeric unit (a) derived from 3-hydroxy-1-adamantyl(meth)acrylate and a polymeric unit (b) derived from β-(meth)acryloyloxy-γ-butyrolactone wherein the lactone ring may optionally be substituted by alkyl; and an acid generating agent (Y).

2 Claims, No Drawings

CHEMICALLY AMPLIFIED POSITIVE RESIST COMPOSITION

BACKGROUND OF THE INVENTION

The present invention relates to a chemical amplifying type positive resist composition used in the minute processing of a semiconductor.

In general, a lithography process using a resist composition has been adopted in the minute processing of a semiconductor. In lithography, the resolution can be improved with a decrease in wavelength of exposure light in principle as expressed by the equation of Rayleigh's diffraction limited. A g-line with a wavelength of 436nm, an i-line with a wavelength of 365 nm, and a KrF excimer laser with a wavelength of 248 nm have been adopted as exposure light sources for lithography used in the manufacture of a semiconductor. Thus, the wavelength has become shorter year by year. An ArF excimer laser having a wavelength of 193nm is considered to be promising as a next-generation exposure light source.

A lens used in an ArF excimer laser exposure machine or an exposure machine using a light-source of shorter wavelength has a shorter lifetime as compared with lenses for conventional exposure light sources. Accordingly, the shorter time required for exposure to ArF excimer laser light is desirable. For this reason, it is necessary to enhance the sensitivity of a resist. Consequently, there has been used a so-called chemical amplifying type resist, which utilizes the catalytic action of an acid generated due to exposure, and contains a resin having a group cleavable by the acid.

It is known that, desirably, resins used in a resist for ArF excimer laser exposure have no aromatic ring in order to ensure the transmittance of the resist, but have an alicyclic ring in place of an aromatic ring in order to impart a dry etching resistance thereto. Various kinds of resins such as those described in Journal of Photopolymer Science and Technology, Vol. 9, No. 3, pages 387–398 (1996) by D. C. Hofer, are heretofore known as such resins. However, conventionally known resins have a problem that peeling off of a pattern tends to occur due to insufficient adhesion at development especially when the polarity is insufficient.

Journal of Photopolymer Science and Technology, Vol. 9, No. 3, pages 475–487 (1996) by S. Takechi et al., and JP-A-9-73173 reported that when a polymer or copolymer of 2-methyl-2-adamantyl methacrylate is used as a resin of a chemical amplifying type, 2-methyl-2-adamantyl is cleaved by an action of an acid to act as a positive type, and high dry etching resistance and high resolution as well as good adhesion to a substrate can be attained.

However, a resin having an alicyclic ring generally exhibits a high hydrophobicity and hence does not have a favorable affinity with a developer, which is an aqueous alkali.

On the other hand, a resin used in a resist for KrF excimer laser exposure usually is a polyvinylphenol resin wherein a part of the hydroxyl groups is protected by a group cleavable by an action of acid. In this case, resolution can be improved by raising the protection ratio. However, if the protection ratio is raised, hydrophobicity of the resin rises and its affinity with a developer deteriorates. When the hydrophobicity of the resin is high and the affinity with a developer is unsatisfactory, uniform development cannot be achieved with the result that the dimensional uniformity of a resulting pattern is affected or a development defect occurs.

An object of the present invention is to provide a chemically amplified positive resist composition containing a resin component and an acid generating agent which is suitable for use in excimer laser lithography utilizing ArF, KrF or the like, and is satisfactory in various resist performance characteristics such as sensitivity, resolution and adhesion to a substrate while exhibiting an excellent affinity (wettability) with respect to an alkali developer.

JP-A-10-274852 has reported that the use of a resin having a butyrolactone residue in part of a polymeric unit thereof for a chemically amplified positive resist composition improves the adherence of the resist composition to a substrate. Also, JP-A-11-305444has reported that the use of a resin having polymeric units derived from 2-alkyl-2-adamantyl (meth)acrylate and from maleic anhydride, respectively, for a chemically amplified resist composition improves the adherence of the resist composition to a substrate.

Further, JP-A-2000-137327 has described use of a resin having a polymeric unit derived from 2-alkyl-2-adamantyl (meth)acrylate and a polymeric unit derived from 3-hydroxy-1-adamantyl (meth)acrylate in a chemically amplified positive resist composition. Also, JP-A-2000-227658 has described use of a resin having a polymeric unit derived from hydroxystyrene and a polymeric unit derived from 3-hydroxy-1-adamantyl (meth)acrylate in a chemically amplified positive resist composition. The inventors of the present invention have conducted a further study based on these knowledge, and further discovered the fact that resolution and wettability with an alkali developer of a chemically amplified positive resist composition can be improved by using a resin containing a polymeric unit of high polarity as well as a polymeric unit of a specified adamantane structure. The present invention has been completed based on this discovery.

SUMMARY OF THE INVENTION

The present invention provides a chemically amplified positive resist composition comprising a resin (X)
which, per se, is insoluble or slightly soluble in alkali but becomes soluble in alkali due to an action of acid, and has a polymeric unit (a) derived from 3-hydroxy-1-adamantyl(meth)acrylate and a polymeric unit (b) derived from β(meth)acryloyloxy-γ-butyrolactone wherein the lactone ring may optionally be substituted by alkyl; and an acid generating agent (Y).

DETAILED DESCRIPTION OF THE PREFERRED EMBODIMENTS

The polymeric unit(a) derived from 3-hydroxy-1-adamantyl (meth)acrylate and the polymeric unit (b) derived from β-(meth)acryloyloxy-γ-butyrolactone wherein the lactone ring may optionally be substituted by alkyl are represented by the following formulae (I) and (II), respectively:

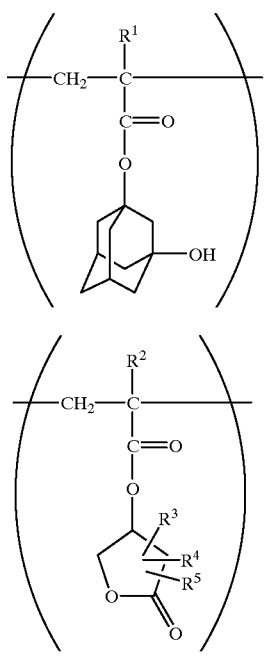

where $R^1$ and $R^2$ each independently represent hydrogen or methyl, and $R^3$, $R^4$ and $R^5$ each independently represent hydrogen or alkyl. Usually, the alkyl represented by $R^3$, $R^4$ or $R^5$ has about 1 to 6 carbon atoms. When number of the carbon atoms is 3 or more, the alkyl may be straight-chained or branched.

Examples of the alkyl represented by $R^3$, $R^4$ or $R^5$ include methyl, ethyl, propyl and butyl. Examples of the monomers used for deriving the polymeric unit of formula (II) include β-acryloyloxy-γ-butyrolactone, β-methacryloyloxy-γ-butytolactone, β-acryloyloxy-α-methyl-γ-butyrolactone, β-methacryloyloxy-α-methyl-γ-butyrolactone, β-acryloyloxy-β-methyl-γ-butyrolactone and β-methacryloyloxy-β-methyl-γ-butyrolactone.

3-Hydroxy-1-adamantyl(meth)acrylate used for deriving the polymeric unit of formula (I) is commercially available. Alternatively, it may be prepared by hydrolyzing 1,3-dibromoadamantane into 1,3-dihydroxyamadantane which is then reacting with acrylic acid, methacrylic acid, or their halide.

β-(Meth)acryloyloxy-γ-butyrolactone wherein the lactone ring may optionally be substituted by alkyl may be prepared by reacting β-bromo-γ-butyrolactone wherein the lactone ring may optionally be substituted by alkyl with acrylic acid or methacrylic acid. Alternatively, it may be prepared by reacting β-hydroxy-γ-butyrolactone wherein the lactone ring may optionally be substituted by alkyl with acrylic acid halide or methacrylic acid halide.

Since the resin (X), per se, is insoluble or slightly soluble in alkali but becomes soluble in alkali due to an action of acid, it usually contains a polymeric unit having an acid labile group in addition to the polymeric unit (a) derived from 3-hydroxy-1-adamantyl(meth)acrylate and the polymeric unit (b) derived from β- (meth)acryloyloxy-γ-butyrolactone. The polymeric unit having an acid labile group may be a polymeric unit having phenolic hydroxyl group, a carboxylic group or the like which is protected by a group having dissolution inhibiting ability against an alkali developer but being cleavable by an action of acid. The acid labile group may be one of various known protective groups.

Examples of the acid labile group, that is a group having dissolution inhibiting ability against an alkali developer but being cleavable by an action of acid, include groups containing a quaternary carbon atom bonded or to be bonded to an oxygen atom, such as tert-butyl, tert-butoxycarbonyl and tert butoxycarbonylmethyl; acetal type groups such as tetrahydro-2-pyranyl, tetrahydro-2-furyl, 1-ethoxyethyl, 1-(2-methylpropoxy)ethyl, 1-(2-methoxyethoxy)ethyl, 1-(2-acetoxyethoxy)ethyl, 1-[2-(1-adamantyloxy)ethoxy]ethyl and 1-[2-(1-adamantancarbonyloxy)ethoxy]ethyl; residues of non-aromatic cyclic compounds such as 3-oxocyclohexyl, 4-methyltetrahydro-2-pyrone-4-yl and 2-alkyl-2-adamantyl. The hydrogen atom in a phenolic hydroxyl group or a carboxyl group in the polymeric unit is substituted with such an acid labile group.

The acid labile group can be introduced into a resin having a phenolic hydroxyl group, a caroboxyl group or the like by subjecting the resin to a known protective group introducing reaction, or by a copolymerization of an unsaturated monomer having such an acid labile group, such as (meth)acrylic ester having such an acid labile group, with other monomers.

Particularly, in a resist for ArF excimer laser exposure, it is preferred that the resin(X) has a polymeric unit derived from 2-alkyl-2-adamantyl (meth)acrylate in which 2-alkyl-2-adamantyl group is an acid labile group, since the group gives the resist high transmittance against ArF excimer laser, high contrast and excellent resolution.

The polymeric unit derived from 2-alkyl-2-adamantyl (meth)acrylate can be represented by the following formula (III):

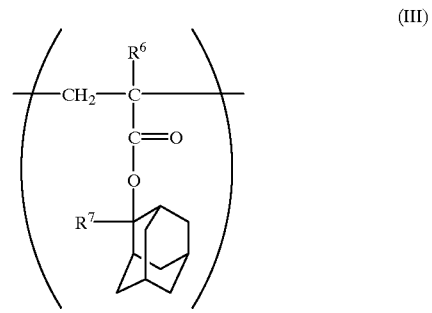

wherein $R^6$ represents hydrogen or methyl, and $R^7$ represents an alkyl.

Since 2-alkyl-2-adamantyl in the polymeric unit of the formula (III) derived from 2-alkyl-2-adamantyl (meth) acrylate is cleavable due to an action of acid, this unit contributes to an enhancement in the solubility in alkali of the resist film having undergone exposure. Further, by virtue of the presence of an adamantane ring, an alicyclic ring, derived from 2-alkyl-2-adamantyl (meth)acrylate, the polymeric unit provides the resulting resist with a high transmittance with respect to ArF excimer laser light, a high contrast and a superior resolution, and contributes to an improvement in dry etching resistance.

In the formula (III), $R^7$ is an alkyl which can have, for example, about 1 to 8 carbon atoms and which is advantageously a straight chain in general but may be a branched chain when the number of carbon atoms is 3 or more. Examples of $R^3$ include methyl, ethyl, n-propyl, isopropyl and n-butyl.

2-Alkyl-2-adamantyl (meth)acrylate, from which the polymeric unit(b) of the formula (III) is derived, is usually prepared by reacting 2-alkyl-2-adamantanol or a metal salt thereof with an acrylic acid halide or a methacrylic acid halide.

The resin(X) may optionally contain an additional polymeric unit as desired in addition to the polymeric unit (a) derived from 3-hydroxy-1-adamantyl(meth)acrylate, the polymeric unit (b) derived from β-(meth)acryloyloxy-γ-butyrolactone, and the polymeric unit having an acid labile group. The resin (X) may be produced by a copolymerization of the above monomers, that is, 3-hydroxy-1-adamantyl(meth)acrylate, β-(meth)acryloyloxy-γ-butyrolactone and, a monomer used for deriving the polymeric unit having an acid labile group and other optional monomers.

The copolymerization can be conducted according to a conventional method. For example, the resin (X) can be obtained by dissolving the monomers in an organic solvent, then conducting a polymerization reaction in the presence of a polymerization initiator, such as an azo compound. Examples of the azo compound include 2,2'-azobisisobutyronitrile and 2,2'-azobis(2-methylpropionate). It is advantageous that the reaction product is purified by re-precipitation or the like, after completion of the polymerization reaction.

It is usually preferred, in the copolymerization, that ratio in mol of the total amount of the 3-hydroxy-1-adamantyl (meth)acrylate and β-(meth)acryloyloxy-γ-butyrolactone wherein the lactone ring may optionally be substituted by alkyl to the amount of a monomer used for deriving the polymeric unit having an acid labile group is about 2:8 to 8:2, although the preferable ranges may vary depending on the kind of radiation used for patterning exposure and the kind of the optional monomers used if desired. Ratio in mol of a polymeric unit (a) derived from 3-hydroxy-1-adamantyl (meth)acrylate to a polymeric unit (b) derived from β-(meth)acryloyloxy-γ-butyrolactone wherein the lactone ring may optionally be substituted by alkyl is about 2:8 to 8:2.

The acid generator(Y) which is another component is decomposed to generate an acid by irradiating the component itself or a resist composition including the component with radioactive rays such as light and an electron beam. The acid generated from the acid generator acts on the resin to cleave the group which is to be cleaved by an action of an acid present in the resin. Examples of such acid generators include onium salt compounds, organic halogen compounds, sulfone compounds, and sulfonate compounds. Specifically, the following compounds can be mentioned:

diphenyliodonium trifluoromethanesulfonate,
4-methoxyphenylphenyliodonium hexafluoroantimonate,
4-mthoxyphenylphenyliodonium trifluoromethanesulfonate,
bis(4-tert-butylphenyl)iodonium tetrafluoroborate,
bis(4-tert-butylphenyl)iodonium hexafluorophosphate,
bis(4-tert-butylphenyl)iodonium hexafluoroantimonate,
bis (4-tert-butylphenyl) iodonium trifluoromethanesulfonate,
triphenylsulfonium hexafluorophosphate,
triphenylsulfonium hexafluoroantimonate,
triphenylsulfonium trifluoromethanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphthoylmethyl)thiolanium hexafluoroantimonate,
1-(2-naphthoylmethyl) thiolaniumtrifluoromethanesulfonate,
4-hydroxy-1-naphthyldimethylsulfonium hexafluoroantimonate,
4-hydroxy-1-naphthyldimethylsulfonium trifluoromethanesulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazi ne,
2-(4-methoxy-1-naphthyl)-4,6-bis(trichloromethyl)-1,3, 5-triazine,
2-(benzo[d][1,3]dioxolane-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5 -triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
1-benzoyl-1-phenylmethyl p-toluenesulfonate (so-called benzointosylate),
2-benzoyl-2-hydroxy-2-phenylethyl p-toluenesulfonate (so-called α-methylolbenzointosylate),
1,2,3-benzenetriyl trimethanesulfonate,
2,6-dinitrobenzyl p-toluenesulfonate,
2-nitrobenzyl p-toluenesulfonate,
4-nitrobenzyl p-toluenesulfonate,
diphenyl disulfone,
di-p-tolyl disulfone,
bis(phenylsulfonyl)diazomethane,
bis(4-chlorophenylsulfonyl)diazomethane,
bis(p-tolylsulfonyl) diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
N-(phenylsulfonyloxy)succinimide,
N-(trifluoromethylsulfonyloxy)succinimide, N-(trifluoromethylsulfonyloxy)phthalimide, N-(trifluoromethylsulfonyloxy)-5-norbornene-2,3-dicarboxy imide, N-(trifluoromethylsulfonyloxy)naphthalimide, N-(10-camphorsulfonyloxy)naphthalimide, and the like.

It is also known that, generally in a chemical amplifying type positive resist composition, performance deterioration due to the deactivation of an acid associated with leaving after exposure can be reduced by adding basic compounds, especially basic nitrogen-containing organic compounds such as amines as quenchers. It is also preferable in the present invention that such basic compounds are added. Concrete examples of the basic compounds to be used as quenchers include the ones represented by the following formulae:

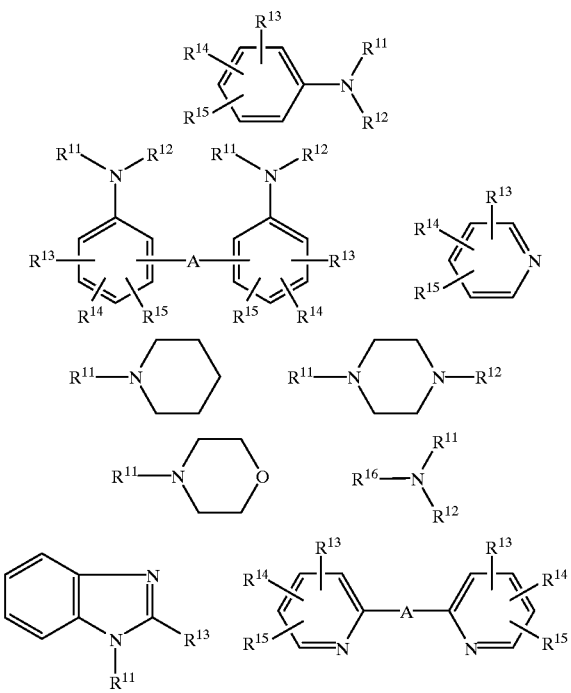

wherein $R^{11}$ and $R^{12}$ represent, independently each other, hydrogen, cycloalkyl, aryl or alkyl which may be optionally substituted with a hydroxyl; $R^{13}$, $R^{14}$ and $R^{15}$, which are same or different from each other, represent hydrogen, cycloalkyl, aryl, alkoxy or alkyl which may be optionally substituted with a hydroxyl; $R^{16}$ represents cycloalkyl or alkyl which may be optionally substituted with a hydroxyl; A represents alkylene, carbonyl or imino. The alkyl represented by $R^{11}$ to $R^{16}$ and alkoxy represented by $R^{13}$ to $R^{15}$ may have about 1 to 6 carbon atoms. The cycloalkyl may have about 5 to 10 carbon atoms and the aryl may have about 6 to 10 carbon atoms. The aryl represented by $R^{11}$ to $R^{15}$ may have about 6 to 10 carbon atoms. The alkylene represented by A may have about 1 to 6 carbon atoms and may be straight-chained or branched.

The resist composition of the present invention preferably contains the resin(X) in an amount in the range of 80 to 99.9% by weight, and the acid generating agent(Y) in an of 0.1 to 20% by weight based on the total amount of the resin(X) and the acid generating agent(Y). When a basic compound is used as a quencher, it is preferably contained in an amount in the range of 0.0001 to 0.1% by weight based on the total solid component weight of the resist composition. The composition may also contain, if required, various additives such as sensitizers, dissolution inhibitors, resins other than resin(X), surfactants, stabilizers, and dyes so far as the objets of the present invention is not harmed.

The resist composition of the present invention generally becomes a resist solution in the state in which the above-described components are dissolved in a solvent to be applied on a substrate such as a silicon wafer. The solvent herein used may be one which dissolves each component, has an appropriate drying rate, and provides a uniform and smooth coating after evaporation of the solvent, and can be one which is generally used in this field. Examples thereof include glycol ether esters such as ethylcellosolve acetate, methylcellosolve acetate, and propylene glycol monomethyl ether acetate; esters such as ethyl lactate, butyl acetate, amyl acetate, and ethyl pyruvate; ketones such as acetone, methyl isobutyl ketone, 2-heptanone, and cyclohexanone; and cyclic esters such as γ-butyrolactone. These solvents can be used alone or in combination of two or more thereof.

The resist film applied on a substrate, and dried is subjected to an exposure treatment for patterning. Then, after a heat-treatment for promoting a protecting deblocking reaction, development by an alkali developer is conducted. The alkali developer herein used can be various kinds of alkaline aqueous solutions used in this field. In general, an aqeous solution of tetramethylammoniumhydroxide or (2-hydroxyethyl)trimethylammoniumhydroxide (so-called colline) is often used.

The present invention will be described in more detail by way of examples, which should not be construed as limiting the scope of the present invention. All parts in examples are by weight unless otherwise stated. The weight-average molecular weight is a value determined from gel permeation chromatography using polystyrene as a reference standard.

Monomer Synthesis 1 (Synthesis of 2-methyl-2-adamantyl methacrylate)

A vessel was charged with 83.1 g of 2-methyl-2-adamantanol and 101 g of triethylamine, and 200 g of methyl isobutyl ketone was added thereto to form a solution. To the solution was added dropwise 78.4 g of methacrylic acid chloride(1.5 times the molar amount of 2-methyl-2-adamantanol), followed by stirring for about 10 hours at room temperature. After filtration, the resulting organic layer was washed with an aqueous solution of 5 wt % sodium bicarbonate and then washed with water twice. The organic layer was concentrated and then distilled under reduced pressure to obtain 2-methyl-2-adamantyl methacrylate represented by the following formula.

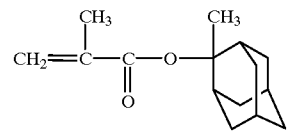

Monomer Synthesis 2 (Synthesis of 2-ethyl-2-adamantyl methacrylate)

To 31.1 g of 2-adamantanone was added 50 g of diethyl ether to form a solution. To the solution was added dropwise 200 ml of a solution of ethyllithium (at a concentration of 1.14 mol/L) in diethyl ether while keeping the solution at a temperature not higher than 10° C. After stirring for two hours at 0° C., methacrylic acid chloride in an amount of 26.2 g (1.2 times the molar amount of 2-adamantanone) was added dropwise to the solution while keeping the solution at a temperature not higher than 10° C. After the dropwise addition was completed, the resulting mixture was stirred for about 12 hours at room temperature. Thereafter, the precipitated organic salt was filtered off. The resulting organic layer was washed with an aqueous solution of 5 wt % sodium bicarbonate and then washed with water twice. The organic layer was concentrated and then distilled under reduced pressure to obtain 2-ethyl-2-adamantyl methacrylate represented by the following formula.

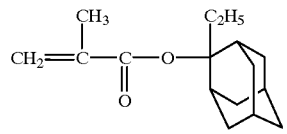

Monomer Synthesis 3 (Synthesis of α-methacryloyloxy-γ-butyrolactone)

A vessel was charged with 100 g of α-bromo-γ-butyrolactone and 104.4 g of methacrylic acid(2.0 times the molar amount of α-bromo-γ-butyrolactone). Then, methyl isobutyl ketone in a weight three times the weight of α-bromo-γ-butyrolactone was added thereto to form a solution. To the solution was added dropwise 183.6 g of triethylamine(3.0 times the molar amount of α-bromo-γ-butyrolactone), followed by stirring for about 10 hours at room temperature. After filtration, the resulting organic layer was washed with an aqueous solution of 5 wt % sodium bicarbonate and then washed with water twice. The organic layer was concentrated to obtain α-methacryloyloxy-γ-butyrolactone represented by the following formula.

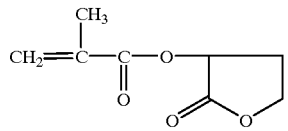

Resin Synthesis 1 (Synthesis of a 2-methyl-2-adamantyl methacrylate/3-hydroxy-1-adamantyl methacrylate/β-methacryloyloxy-γ-butyrolactone copolymer)

In a reaction vessel, 13.8 g of 2-methyl-2-adamantyl methacrylate, 6.9 g of 3-hydroxy-1-adamantylmethacrylate and 5.0 g of β-methacryloyloxy-γ-butyrolactone were charged (molar ratio of 5:2.5:2.5). To the mixture, methylisobutyl ketone, the amount thereof being two times by weight based on the total amount of the monomers, was added to form a monomer solution. Then, 2,2'-azobisisobutyronitrile as the polymerization initiator, the amount thereof being 2% by mol based on the total amount of the monomers, was added, and the resulting solution was stirred for about 5 hours at 85. The resulting reaction solution was added to a large quantity of heptane to precipitate the polymer product, which was then filtered. The polymer product obtained by the filtration was dissolved in methylisobutyl ketone, and the obtained solution was mixed with a large quantity of heptane to re-precipitate the polymer product, which was then filtered. The above procedure from dissolution of the polymer product to re-precipitation was repeated once more in order to purify the product. A copolymer having weight-average molecular weight of about 14,000 was obtained. The copolymer thus obtained referred to as resin A1.

Resin Synthesis 2 (Synthesis of a 2-ethyl-2-adamantyl methacrylate/3-hydroxy-1-adamantyl methacrylate/β-methacryloyloxy-γ-butyrolactone copolymer)

The same procedures as in Resin Synthesis 1 were repeated except that 13.8 g of 2-methyl-2-adamantyl methacrylate was replaced with 14.6 g of 2-ethyl-2-adamantyl methacrylate.

(Molar ratio of 2-ethyl-2-adamantyl methacrylate, 3-hydroxy-1-adamantyl methacrylate and β-methacryloyloxy-γ-butyrolactone was 5:2.5:2.5. ) A copolymer having weight-average molecular weight of about 9,300 was obtained. The copolymer thus obtained referred to as resin A2.

Resin Synthesis 3 (Synthesis of a 2-methyl-2-adamantyl methacrylate/β-methacryloyloxy-γ-butyrolactone copolymer, for comparison)

The same procedures as in Resin Synthesis 1 were repeated except that 6.9 g of 2-methyl-2-adamantyl methacrylate and 5.0 g of β-methacryloyloxy-γ-butyrolactone were charged (molar ratio of 5:5) in place of 13.8 g of 2-methyl-2-adamantyl methacrylate, 6.9 g of 3-hydroxy-1-adamantyl methacrylate and 5.0 g of β-methacryloyloxy-γ-butyrolactone. A copolymer having weight-average molecular weight of about 10,000 was obtained. The copolymer thus obtained referred to as resin AX.

Resist compositions are prepared using the resins obtained above and the following acid generating agents B1 and B2.

Acid generating agent
  B1: p-tolyldiphenylsulfonium trifluoromethanesulfonate
  B2: p-tolyldiphenylsulfonium perfluorooctanesulfonate

EXAMPLES 1 AND 2 AND COMPARATIVE EXAMPLE

Components listed below were mixed and filtered through a fluorine resin filter having a pore diameter of 0.2 μm to give resist solutions.

TABLE 1

| | |
|---|---|
| Resin (listed in Table 1) | 10 parts |
| Acid generating agent | |
| (Amounts and kinds thereof are listed in Table 1): | |
| Quencher: 2,6-diisopropylaniline | 0.0075 parts |
| Solvent: propyleneglycol monomethylether acetate | 57 parts |
| γ-butyrolactone | 3 parts |

On a silicon wafer, a composition "DUV-30J-14" manufactured by Brewer Co. Ltd. was applied and baked under conditions of 215° C. for 60 seconds so that an organic reflection-preventing membrane having a thickness of 1,600 angstrom was formed on the wafer. The resist solution obtained above was applied by spin-coating on said wafer so that the film thickness after drying was 0.39 μm. After applying the resist solution, the wafer was pre-baked on a direct hotplate at a temperature shown in Table 1, column "PB" for 60 seconds.

Ultra pure water was applied on the pre-baked resist film and contact angle was measured by a contact angle measuring apparatus (Ermagoniometer type manufactured by ERMA Inc.) The results are shown in Table 1.

The wafer having a resist film formed thereon was irradiated with an ArF eximer stepper ["NSR-ArF", manufactured by Nikon, NA=0.55, σ=0.6] through a line-and-space pattern, changing stepwise the exposure amount. The exposed wafer was subjected to post-exposure baking (PEB) on a hot plate at a temperature shown in Table 1, column "PEB" for 60 seconds. Then the wafer was subjected to paddle development with 2.38% by weight aqueous tetramethyl ammonium hydroxide solution for 60 seconds. The developed bright field pattern was observed by a scanning electron microscope and assessed for the effective sensitivity and the resolution by the following methods:

Effective sensitivity: This is expressed in the minimum amount of exposure which gave 1:1 line-and-space pattern of 0.18 μm.

Resolution: This is expressed in the minimum size which gave line-and-space pattern split at the exposure amount of the effective sensitivity.

A bright field pattern is obtained by exposure and development through a reticle comprising an outer frame formed of a chromium layer (lightproof layer) and linear chromium layers (lightproof layers) formed on a surface of a glass substrate (light-transmissive portion). Accordingly, after exposure and development, portions of the resist layer surrounding a line and space pattern is removed with a portion of the resist layer corresponding to the outer frame being left outside the line and space pattern.

|  | Resin | Acid Generating agent (parts) | PB (° C.) | PEB (° C.) | Contact angle | Effective sensitivity (mJ/cm2) | Resolution (μm) |
|---|---|---|---|---|---|---|---|
| Example 1 | A1 | B1(0.1) | 150 | 130 | 61° | 40 | 0.16 |
| Example 2 | A2 | B2(0.2) | 130 | 130 | 61° | 36 | 0.16 |
| Comparative Example | AX | B1(0.1) | 120 | 120 | 68° | 56 | 0.17 |

As seen from Table 1, when the resist containing the resin specified by the present invention was used in an ArF excimer laser exposure, the contact angle between the resist coat and water was decreased as compared with the comparative example. This means that the resist has an improved affinity with the developer and hence is effective in improving the line width uniformity and reducing the possibility of defective development. In the Examples, resolution and sensitivity are also improved as compared with the comparative example.

The chemically amplified positive resist composition of the present invention is capable of giving a resist film excellent in adhesion to a substrate and excellent in various resist performance characteristics such as dry etching resistance, sensitivity and resolution. It is also capable of forming a resist coat exhibiting a high hydrophilicity and hence decreasing the contact angle between the resist coat and water. Due to the high hydrophilicity and the small contact angle, the resist composition exhibits good developing performance. Accordingly, the resist composition is suitable for use in an exposure process utilizing a KrF excimer laser, an ArF excimer laser or the like, and gives a resist pattern with high performance.

What is claimed is:

1. A chemically amplified positive resist composition comprising:

a resin (X) which, per se, is insoluble or slightly soluble in alkali but becomes soluble in alkali due to an action of acid, and has a polymeric unit (a) derived from 3-hydroxy-1-admantyl(meth)acrylate and a polymeric unit (b) derived from β-(meth)acryloyloxy-γ-butyrolactone wherein the lactone ring may optionally be substituted by alkyl; and an acid generating agent (Y);

wherein a ratio in mol of the polymeric unit (a) derived from 3-hydroxy-1-adamantyl(meth)acrylate to the polymeric unit (b) derived from β-(meth)acryloyloxy-γ-butyrolactone wherein the lactone ring may optionally be substituted by alkyl is about 2:8 to 8:2.

2. The chemically amplified positive resist composition of claim 1, which is produced by a copolymerization of monomers comprising 3-hydroxy-1-adamantyl(meth)acrylate, β-(meth)acryloyloxy-γ-butyrolactone and a monomer used for deriving the polymeric unit having an acid unstable, wherein a ratio in mol of the total amount of the 3-hydroxy-1-adamantyl(meth)acrylate and the β-(meth)acryloyloxy-γ-butyrolactone to the amount of a monomer used for deriving the polymeric unit having an acid unstable group is about 2:8 to 8:2.

* * * * *